Oct. 13, 1970 L. AUER 3,534,294

FET OSCILLATOR WITH CONSTANT CURRENT SOURCE FOR FREQUENCY STABILIZATION

Filed June 24, 1968

INVENTOR.
LUCIJAN AUER

BY Frank R. Trifari

AGENT 3,534,294
Patented Oct. 13, 1970

3,534,294

FET OSCILLATOR WITH CONSTANT CURRENT SOURCE FOR FREQUENCY STABILIZATION

Lucijan Auer, Woonsocket, R.I., assignor, by mesne assignments, to U.S. Philips Corporation, New York, N.Y., a corporation of Delaware Filed June 24, 1968, Ser. No. 739,541
Int. Cl. H03b *5/12*
U.S. Cl. 331—117 10 Claims

ABSTRACT OF THE DISCLOSURE

An FET oscillator frequency stabilized by the addition of a frequency selective constant current source connected in series with those elements of the FET amplifier that vary their capacitance with changes in bias conditions.

The invention relates to oscillators and in particular to stabilized oscillators using field-effect transistors.

The amplification factor and high input impedance of a field-effect transistor make this component extremely advantageous as the amplifier of a stable oscillator. The voltage sensitive depletion layer capacitance of the gate-channel junctions of a field-effect transistor (however, causes the natural frequency of any associated resonant circuit connected across the channel to vary with changes in the voltage across the channel. The depletion layer capacitance, in fact, may vary by a factor of 5 with changes in bias level. Voltage drift in an associated power supply, therefore, will produce a corresponding undesirable frequency shift in the output of a field-effect transistor oscillator. An FET oscillator operating in the frequency range where the gate channel capacitance becomes an important factor must normally employ a power supply with a rigidly fixed output voltage.

The development of PET oscillators has been retarded by this phenomenon. It is unlikely that, in the near future, component improvements will eliminate the voltage sensitive capacitive effect inherent in the gate channel junction of the field-effect transistor. The use of a power supply having a rigidly fixed output voltage is commercially unfeasible. A complex regulating circuit is an equally undesirable solution. A simple inexpensive circuit that prevents bias voltage changes from altering the effective capacitance of a field-effect transistor in an FET oscillator is necessary to permit the future development of FET oscillators.

An object of the invention is to provide an improved stabilized oscillator. Another object of the invention is to produce an FET oscillator having minimum frequency variations in response to changes in supply voltage.

These, and other objects of the invention are achieved by connecting in series with the voltage sensitive paths of the field-effect transistor a frequency selective constant current source. The constant current source prevents changes in the power supply voltage occurring at a frequency lower than the frequency of the resonant circuit from being developed across the channel of the FET. Higher frequency variations of the power supply output voltage may be effectively filtered by conventional methods before the voltage is supplied to the resonant circuit.

Figure 1:
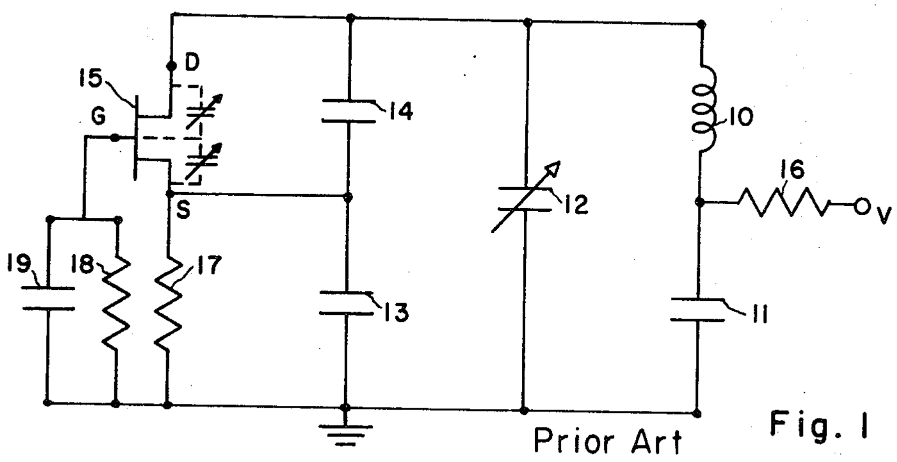
Figure 2:
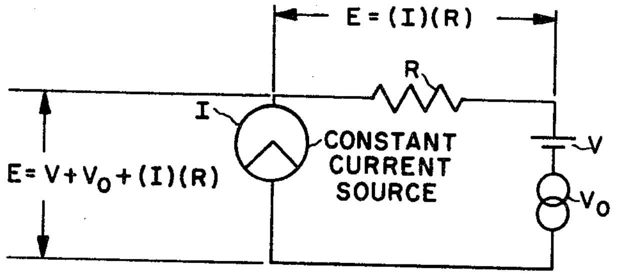

The invention will now be described in greater detail with reference to the accompanying drawing wherein FIG. 1 is a schematic of a known FET oscillator; FIG. 2 is a diagram showing the effect of a constant current source on the voltage across a passive circuit element; and FIG. 3 is a schematic of a device according to the invention showing the voltage sensitive elements of the field-effect transistor.

In FIG. 1 a resonant circuit is shown which consists of coil 10, capacitors 11, 12, 13 and 14, as well as the variable depletion layer capacitances of field-effect transistor 15. A voltage V supplies power to the oscillator through resistor 16 across filter capacitor 11. A resistor 17 is connected in series with the drain to source output path of the field-effect transistor 15. Resistor 18 and parallel connected capacitor 19 bias the gate terminal of the field-effect transistor 15 in a manner analogous to the grid biasing circuit used in association with electron tubes. Oscillations in the resonant circuit are regeneratively fed back to the source terminal S of the field-effect transistor from an AC voltage divider consisting of capacitors 13 and 14, thereby sustaining oscillations.

In FIG. 2, a constant current source having an output current I is shown connected in series with a passive load R, a constant voltage source V and a variable voltage source $V_0$. As is shown in the diagram, the voltage across the passive load R is unaffected by the presence of the constant voltage source V and the variable voltage source $V_0$. The entire effect of these voltage sources appears across the constant current source I, thereby preventing the voltage sources from effecting the voltage drop across the passive load R. The oscillator shown in FIG. 3 includes a resonant circuit similar to that of FIG. 1 and utilizes the principles illustrated in FIG. 2. A field-effect transistor 15 has a drain electrode connected to capacitors 12 and 14, and to coil 10 of the resonant circuit. The gate of transistor 15 is connected to resistor 18 and capacitor 19 as in FIG. 1. The drain-source path of a second FET 30 is connected in series with the drain-source path of FET 15. The source electrode of FET 30 is connected to resistor 17 and capacitor 13.

Figure 3:
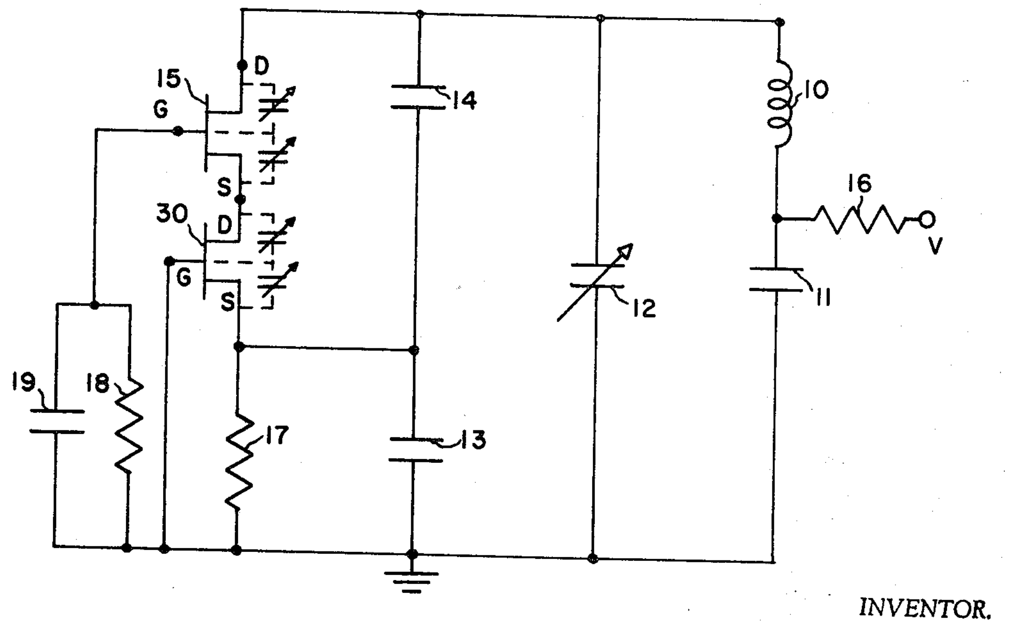

In the operation of the circuit of FIG. 3, transistor 30 in conjunction with resistor 17 and capacitor 13 serves as both an amplifier and a frequency selective constant current source. Although transistor 30 is shown as a field-effect transistor the invention is not limited thereto. Any equivalent amplifier capable of functioning as a constant current source may be employed. Oscillations from the resonant circuit are conducted from capacitor 13 tc the gate source control path of transistor 30 and amplified by this transistor. The amplified oscillations are then regeneratively conducted to the gate source control path of transistor 15 where they are amplified and fed back to the resonant circuit in order to sustain oscillations. The value of capacitor 19 is sufficiently great to make the gate terminal of transistor 15 a virtual ground at frequencies at or above the natural frequency of the resonant circuit. At these frequencies, the resonant circuit therefore is effectively connected across the gate to drain terminals of transistor 15. Variations in the voltage V occurring above the resonant frequency may effectively be by-passed to ground through a judicious selection of capacitor 11. Changes in supply voltage V occurring below the natural frequency of the resonant circuit are developed across the terminals of the constant current source, that is between the drain terminal of transistor 30 and ground. The range of frequencies at which transistor 30 acts as a constant current source may be selected by a proper choice of the filter network consisting of resistor 17 and capacitor 13. The addition of the inexpensive transistor 30 provides effective frequency regulation in the face of changes in power supply voltage. Although the constant current source is shown in conjunction with a common Colpitts oscillator, the invention would work equally as well with most common FET circuits.

While the invention has been described in connection with a specific embodiment, other modifications will be apparent to those skilled in the art without departing from the spirit and scope of the invention.

What is claimed is:

1. In an oscillator stabilized against changes in the output voltage of a power supply, the combination comprising a resonant circuit connected to said power supply, an amplifier, means for regeneratively connecting said resonant circuit to said amplifier, said amplifier having a reactance characteristic varying in response to power supply voltage changes, and a constant current source connected to said amplifier for preventing changes in the output of said voltage supply from developing across said amplifier.

2. An oscillator as claimed in claim 1 wherein said amplifier is a semiconductor device having a control path and an output path, and wherein said regenerative connecting means comprises a first means for connecting the output path of said semiconductor device to said resonant circuit and a second means for regeneratively connecting said resonant circuit to the control path of said semiconductor device.

3. An oscillator as claimed in claim 2 wherein said semiconductor device comprises a field-effect transistor having input, output and common electrodes, wherein said input path of said semiconductor device comprises the input to common electrode path of said transistor, and wherein said output path of said semiconductor device comprises the output to common electrode path of said transistor.

4. An oscillator as claimed in claim 1 wherein said regenerative connecting means includes said constant current source.

5. In an oscillator stabilized against changes in the output voltage of a power supply, the combination comprising a resonant circuit connected to said power supply, an amplifier having a control path and an output path, means for regeneratively connecting said resonant circuit between said control path and said output path, said amplifier having a reactance characteristic varying in response to power supply voltage changes, and a constant current source connected to the output path of said amplifier for preventing changes in the output voltage of said power supply from developing across said output path of said amplifier.

6. A device as claimed in claim 5 wherein said amplifier is a semiconductor device, and wherein said constant current source is a frequency selective constant current source for maintaining those currents having a frequency below the frequency of said resonant circuit constant through the output path of said semiconductor device.

7. A device as claimed in claim 6 wherein said frequency selective constant current source comprises a transistor having input, output and common terminals, means for connecting the input terminal of said transistor to a reference potential, a filter network having a cut-off frequency approximately equal to the frequency of the resonant circuit, means for connecting said common terminal of said transistor to said filter network, and means for connecting said output terminal of said transistor to said amplifier.

8. In an oscillator stabilized against changes in the output voltage of a power supply, the combination comprising a resonant circuit connected to said power supply, a field-effect transistor amplifier having a control path and an output path, means regeneratively connecting said resonant circuit to said control path and said output path of said amplifier for sustaining oscillations in said resonant circuit, said output path of said amplifier having a reactance characteristic varying in response to power supply voltage changes, and a frequency selective constant current source connected in series with the output path of said amplifier for preventing changes in the output voltage of said power supply from developing across said output path of said amplifier.

9. A device as claimed in claim 8 wherein said constant current source includes a transistor device.

10. A device as claimed in claim 8 wherein said constant current source comprises a second field-effect transistor having input, output and control electrodes, means for connecting said control electrode of said second field-effect transistor to a reference potential, a filter circuit having a cut-off frequency approximately equal to the natural frequency of said resonant circuit, means for connecting the common terminal of said second field-effect transistor to said filter circuit, and means for connecting the output terminal of said second field-effect transistor to the output path of said first field-effect transistor amplifier.

References Cited

UNITED STATES PATENTS 3,268,827 8/1966 Carlson et al. ______ 307—304 X

OTHER REFERENCES

Hanchett, "The Field-Effect Transistor as a Stable V.F.O. Element," QST, December 1966, pp. 11–14.

ROY LAKE, Primary Examiner

S. H. GRIMM, Assistant Examiner

U.S. Cl. X.R.

331—109, 175